Nov. 17, 1970 R. K. W. YEE 3,541,466
GATED DIFFERENTIAL AMPLIFIER
Filed Jan. 7, 1969
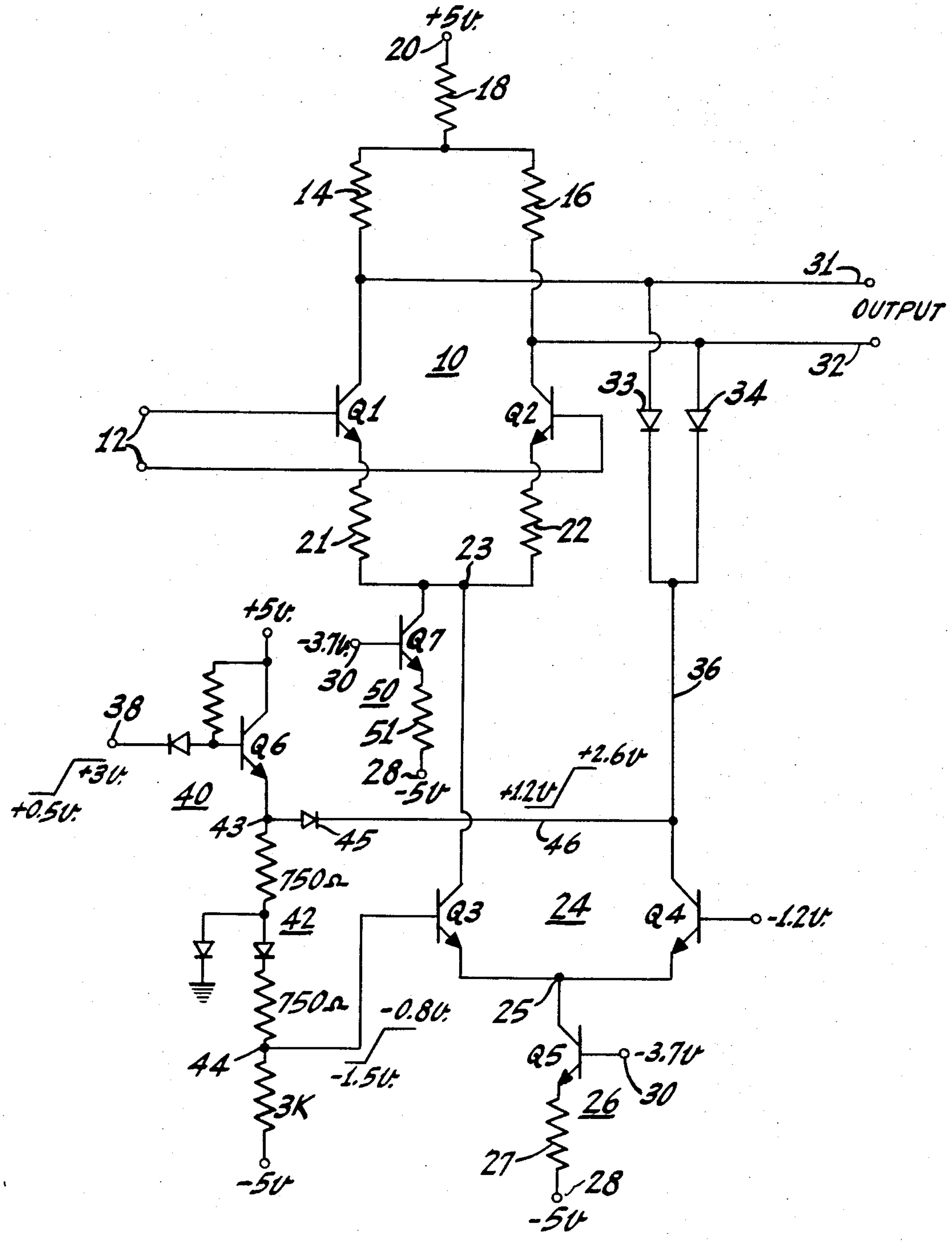
INVENTOR
RAYMOND K. W. YEE
BY Carl V. Olson
ATTORNEY United States Patent Office 3,541,466

Patented Nov. 17, 1970

3,541,466

GATED DIFFERENTIAL AMPLIFIER

Raymond K. W. Yee, Needham, Mass., assignor to RCA Corporation, a corporation of Delaware Filed Jan. 7, 1969, Ser. No. 789,470
Int. Cl. H03f 3/68
U.S. Cl. 330—30 6 Claims

ABSTRACT OF THE DISCLOSURE

A gated amplifier useful, for example, in a memory sense amplifier, includes a differential amplifier having two output impedances. In a standby condition, a first constant current source supplies current through the amplifier output impedances, through a shunting path including two diodes and through one side of a differential switch. A second constant current source supplies current through the amplifier impedances and the amplifier transistors. Input noise occurring during this standby condition causes imbalances in the currents through the two amplifier transistors which are compensated by imbalances in the currents through the two diodes, so that the currents through the output impedances remain balanced. When a gating or strobe signal is applied to reverse the differential switch, current from the first current source is diverted from the paths including the diodes to the paths including the amplifier transistors, and then an input signal is fully amplified.

BACKGROUND OF THE INVENTION

Gated or strobed differential amplifiers are commonly used as sense amplifiers in random-access magnetic memory systems and in many other applications. Such amplifiers are required to be unresponsive to large noise or other undesired input signals when in a standby state, and to be fully responsive to a desired input signal when gated or strobed into an active amplifying state.

A differential memory sense amplifier is subjected to a very large noise input signal during the "write" portion of the memory cycle which tends to saturate the amplifier even though it is in the standby state. A waiting period must be provided for the amplifier to recover from the noise before it can be strobed to respond to the relatively small desired memory sense signals present during the "read" portion of the memory cycle. One approach to the problem is to insure that the amplifying devices are biased to be fully cut off during the standby condition. This has the disadvantage that appreciable time and energy must be devoted to shifting the amplifying devices from the cut-off condition to a signal amplifying condition.

SUMMARY OF THE INVENTION

In accordance with an example of the invention, the amplifying devices in a differential amplifier are shunted by two diodes, and a first constant current is normally directed (during standby) through the diodes. A second constant current source maintains the amplifying devices in a slightly conducting condition. Input noise occurring during standby unbalances the currents through the two amplifying devices, but this is compensated by an equal imbalance in the currents through the two diodes. A differential switch operated by a gating circuit redirects the first constant current to the amplifying devices for quick response to a desired input signal.

THE DRAWING

The sole figure of the drawing is a circuit diagram of a gated differential amplifier constructed according to the teachings of the invention.

DESCRIPTION OF THE PREFERRED EMBODIMENT

Reference is now made in greater detail to the drawing. An input differential amplifier circuit 10 includes transistors Q1 and Q2 having base electrodes connected to input terminals 12. Transistors Q1 and Q2 have individual collector output resistors 14 and 16 having terminal ends connected through a common resistor 18 to a first terminal 20 of a constant current source. The emitters of transistors Q1 and Q2 are connected through small resistors 21 and 22 to a common point 23. The point 23 is connected to the collector electrode of a transistor Q3 of a differential switch 24 which also includes a transistor Q4. The emitter electrodes of transistors Q3 and Q4 are connected through a common point 25 to the collector electrode of a transistor Q5. The transistor Q5 is the current controlling element in a first constant current source 26 having current-supplying terminals 20 and 25 and including emitter resistor 27 and bias terminals 28 and 30.

The collector output electrodes of transistors Q1 and Q2 are connected to output lines 31 and 32. Unidirectional conducting devices or diodes 33 and 34 have anodes connected to respective output lines 31 and 32 and have cathodes connected over a common line 36 to the collector electrode of switch transistor Q4.

Transistors Q3 and Q4 are connected to constitute a differential switch 24 in which solely one or the other of the transistors is conductive at any given time. The transistors are biased so that transistor Q3 is normally off and transistor Q4 is normally on. This condition is normally maintained by the presence of a voltage level of less than one volt at an input gating or strobe terminal 38 of a gating circuit 40.

Gating circuit 40 includes a transistor Q6 connected as an emitter follower having an emitter output circuit 42 including a direct output terminal 43 and a proportioned, level-shifted output 44. The direct output 43 is coupled through diode 45 and over leads 46 and 36 to the cathodes of diodes 33 and 34. The low potential normally presents an output terminal 43 back biases diode 45 and prevents a flow of current over line 46. The proportioned output terminal 44 is connected to the base of differential switch transistor Q3.

The normally-present potential at proportioned output terminal 44 applied to the base of switch transistor Q3 maintains the transistor cut off, and, by differential action in the common emitter circuit, maintains switch transistor Q4 fully conductive. When the input gating voltage level applied to gating terminal 38 is increased to a value of about three volts, the output 44 of follower transistor Q6 causes switch transistor Q3 to be rendered conductive. The constant current available from transistor Q5 thus taken by transistor Q3 from transistor Q4, causes transistor Q4 to be cut off. At the same time, the increased-level gating signal from output terminal 43 of follower transistor Q6 is applied over lines 46 and 36 to back-bias the diodes 33 and 34 and thus prevent them from presenting capacitive loads to the signal output on lines 31 and 32.

As thus far described, the system includes a differential amplifier 10 having output impedances 14 and 16 supplied with a constant current from a first source 26 having a first terminal 20 and a second terminal 25. The constant current supplied through the output impedances 14 and 16 is normally blocked from going through the differential amplifier transistors Q1 and Q2 by the nonconductive state of switch transistor Q3. The constant current applied through output resistors 14 and 16 normally passes through current-shunting diodes 33 and 34 and through the normally-conducting switch transistor Q4 to the second terminal 25 of the source 26. On the other hand, when a positive gating pulse is applied to the base of gating transistor Q6, the conductive conditions of switch transistor Q3 and Q4 reverse so that the constant current is blocked from the path including diodes 33 and 34 and is passed through the paths including differential amplifier transistors Q1 and Q2.

The differential amplifier 10 is provided with a second, additional constant current source 50 having current-supplying terminals 20 and 23, and including a transistor Q7 having an emitter electrode connected through a resistor 51 to a bias terminal 28 and having a base electrode connected to the terminal 30 of a bias source. The second constant current source 50 including transistor Q7 is constructed to always cause a current flow from terminal 20 through output impedances 14 and 16 and through transistors Q1 and Q2 to terminal 23. The amount of current flow provided by the second constant current source 50 is preferably made to be about twenty percent less than the current supplied by the first constant current source 26 including transistor Q5. The total current flowing through output impedances 14 and 16 is always the sum of the currents supplied by the two constant current sources 26 and 50.

The differential output signals from differential amplifier 10 on lines 31 and 32 are coupled to the inputs of amplifying, logic and threshold circuits (not shown).

In the operation of the system shown, signals from a terminated memory sense line, or other source, are connected to the differential amplifier input terminals 12. A memory sense line normally has disturbing noise and high voltages induced on it during the write portion of the memory cycle. These noise voltages tend to saturate the differential amplifier transistors Q1 and Q2 and also transistors in subsequent stages, so that a recovery time must be provided before the transistors can return to a condition in which they are capable of responding to the relatively very low amplitude sense signals occurring during the read portion of the memory cycle.

During the noisy portion of the memory cycle, current is supplied to transistors Q1 and Q2 by solely the second constant current source 50, and the current of the first constant current source 26 is directed solely through the current-shunting diodes 33 and 34. Under these conditions, the noise input to transistors Q1 and Q2 has a limited effect on conduction in the two transistors due to the limited current available from the second constant current source. But more importantly, the current imbalance in transistors Q1 and Q2 due to noise is prevented from appearing as an output signal imbalance on signal output lines 31 and 32. Output signal imbalance is prevented because an equal and opposite imbalance is automatically created in the currents flowing through the paths including diodes 33 and 34.

If, for example, a write noise spike at input terminals 12 causes transistor Q1 to conduct more current, and consequently causes transistor Q2 to conduct less of the constant current available from transistor Q7, there will be a tendency for the voltage on output line 31 to fall, and for the voltage on output line 32 to rise. If the voltage on output line 32 rises, an increased current is made to flow through diode 34, and less current is available to flow through diode 33 because the total current through diodes 33 and 34 is fixed by the constant current source 26. Therefore, an increase in current through transistor Q1 causes a corresponding decrease in current through diode 33, and the sum of the currents through transistor Q1 and diode 33 remains constant. Since the sum of these currents remain constant, and since the sum of these currents flows through output resistor 14, the signal voltage on output line 31 remains constant and unaffected by the input noise. Similarly, the simultaneously occurring decrease in current through transistor Q2 results in an equal and compensating increase in current through diode 34, so that the signal voltage on output line 32 remains unaffected by the noise input.

The described input noise rejection operation of the system is achieved in an arrangement where the differential amplifier transistors Q1 and Q2 are normally maintained in a conductive state during standby conditions. Therefore, the transistors can be very rapidly made fully responsive to a desired input signal by operating the differential switch 24 to permit the additional constant current from source 26 to flow through amplifier transistors Q1 and Q2. It is not necessary to shift the transistors Q1 and Q2 all the way from a nonconducting condition to a conducting condition.

At a selected moment during the read portion of the memory cycle when a sense signal is available at input terminals 12, a gating or strobe pulse is applied to gating input terminal 38 and through follower transistor Q6 to render differential switch transistor Q3 conductive. This automatically causes switch transistor Q4 to be cut off. Under these conditions, the input sense signal is fully amplified by transistors Q1 and Q2 and is applied over output lines 31 and 32 to succeeding circuits.

Although no current flows through diodes 33 and 34 because of the blocked condition of switch transistor Q4, the diodes can present an undesired capacitive loading effect on the desired signals present on output lines 31 and 32. This loading effect is prevented in the present system by the application of the input gating or strobe signal through diode 45 and over lines 46 and 36 to the cathodes of diodes 33 and 34. The signal so applied is a more positive signal which back biases the diodes 33 and 34 and thereby cause them to present a very much higher capacitive impedance to desired signals present on output lines 31 and 32.

What is claimed is:

1. The combination of a differential amplifier including two amplifying devices having signal input terminals connected for differential action, and each having a signal output terminal connected through an output impedance to a common bias terminal, current shunting paths each including a unidirectional conduction device connected to a respective one of said signal output terminals of said amplifying devices, a first constant current source connected normally to supply a first constant current from said first bias terminal through said output impedances and thence through said unidirectional conduction devices, a second constant current source connected to supply a second constant current from said bias terminal through said output impedances and through corresponding amplifying devices, and means to redirect said first constant current from said current shunting paths to said differential amplifier.

2. The combination defined in claim 1 wherein said means to redirect said first constant current comprises a differential switch.

3. The combination defined in claim 2 wherein said means to redirect said first constant current includes a gating circuit having an output coupled to control said differential switch.

4. The combination defined in claim 3 wherein said gating circuit includes a second output coupled to back bias said unidirectional conduction devices.

5. A gated amplifier which is insensitive to input noise when in a normal standby condition, comprising a differential amplifier including two amplifying devices having signal input terminals connected for differential action, and each having a signal output terminal connected through an output impedance to a common bias terminal, current shunting paths each including a unidirectional conduction device connected to said signal output terminals of said amplifying devices, a differential switch having one normally-open switch element in circuit with said amplifying devices and having another normally-closed switch element in circuit with said unidirectional conduction devices, a first constant current source connected to supply a first constant current from said first bias terminal through said output impedances and thence through said amplifying devices and associated normally-open switch element, or through said unidirectional conduction devices and associated normally-closed switch element, to a common return path, a second constant current source connected to supply a second constant current, from said bias terminal, which divides through said output impedances and corresponding amplifying devices and then recombines in a common return path, whereby a noise signal causing an imbalance in the currents from said second constant current source through said two amplifying devices results in an equal and opposite imbalance in the currents from said first constant current source through said two current shunting paths, with the result that the voltages at said signal output terminals remain substantially balanced, and means to apply a gating pulse to said differential switch to redirect said first constant current from said current shunting paths to said differential amplifier to enable it to respond to an input signal.

6. A gated amplifier as defined in claim 5 wherein said means to apply a gating pulse includes means to simultaneously back bias said unidirectional conduction devices.

References Cited

McMullen, "Transistorized Commutator," Revue of Scientific Instruments, July 1959.

ROY LAKE, Primary Examiner

L. J. DAHL, Assistant Examiner

U.S. Cl. X.R.

307—241